United States Patent
Takano

(10) Patent No.: US 6,828,235 B2
(45) Date of Patent: Dec. 7, 2004

(54) SEMICONDUCTOR MANUFACTURING METHOD, SUBSTRATE PROCESSING METHOD, AND SEMICONDUCTOR MANUFACTURING APPARATUS

(75) Inventor: Satoshi Takano, Tokyo (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 09/819,690

(22) Filed: Mar. 29, 2001

(65) Prior Publication Data

US 2002/0020344 A1 Feb. 21, 2002

(30) Foreign Application Priority Data

Mar. 29, 2000 (JP) ........................................ 2000-091642
Mar. 5, 2001 (JP) ........................................ 2001-060136

(51) Int. Cl.$^7$ ............................................. H01L 21/44
(52) U.S. Cl. ...................... 438/680; 438/478; 438/479; 438/778; 438/913; 118/50; 118/715; 118/900; 414/935; 414/936; 414/937; 414/938; 414/939
(58) Field of Search ................................ 436/680, 694, 436/478–79, 906, 913, 778; 414/271, 935, 936–939; 118/715, 900, 50

(56) References Cited

U.S. PATENT DOCUMENTS

| | | | |
|---|---|---|---|
| 2,508,948 A | | 5/1950 | Hovermale |
| 5,462,397 A | | 10/1995 | Iwabuchi |
| 5,616,208 A | | 4/1997 | Lee |
| 5,873,942 A | * | 2/1999 | Park et al. .................. 118/719 |
| 6,037,272 A | * | 3/2000 | Park et al. .................. 438/758 |
| 6,328,864 B1 | * | 12/2001 | Ishizawa et al. ........ 204/298.01 |
| 2001/0020516 A1 | * | 9/2001 | Khan et al. ................. 156/345 |
| 2002/0052094 A1 | * | 5/2002 | Ryan et al. ................. 438/464 |
| 2002/0090818 A1 | * | 7/2002 | Thilderkvist et al. ...... 438/689 |
| 2002/0092763 A1 | * | 7/2002 | Denning et al. ....... 204/192.17 |
| 2002/0114886 A1 | * | 8/2002 | Chou et al. .......... 427/255.391 |

FOREIGN PATENT DOCUMENTS

| | | |
|---|---|---|
| JP | A 04-100222 | 4/1992 |
| JP | A 5-304273 | 11/1993 |
| JP | A 6-104178 | 4/1994 |
| JP | A 06-151558 | 5/1994 |
| JP | A 09-320970 | 12/1997 |
| JP | A 2000-150815 | 5/2000 |
| KR | 1996-0002603 | 11/2000 |
| KR | 1994-0022935 | 12/2000 |

* cited by examiner

Primary Examiner—Matthew S. Smith
Assistant Examiner—Granvill D. Lee, Jr.
(74) Attorney, Agent, or Firm—Oliff & Berridge, PLC

(57) ABSTRACT

It is an object of the present invention to adjust the transfer environment of a substrate in order to prevent contamination of the substrate surface by impurities. A semiconductor manufacturing apparatus comprises a load-lock chamber 1 in which substrate exchange with the outside is performed, a wafer process chamber 2 in which the wafer is subjected to a predetermined processing, and a transfer chamber 3 in which the wafer is transferred between the load-lock chamber 1 and the wafer process chamber 2. In a semiconductor manufacturing method in which this semiconductor manufacturing apparatus is used to treat a substrate, an inert gas ($N_2$) is supplied to and exhausted from the load-lock chamber 1, the transfer chamber 3, and the wafer process chamber 2 while the substrate is being transferred from the load-lock chamber 1 to the wafer process chamber 2 through the transfer chamber 3, and the substrate transfer is carried out with a predetermined pressure maintained.

17 Claims, 7 Drawing Sheets

| SUBSTRATE TRANSFER PRESSURE | | CARBON CONCENTRATION (atoms/cm²) |
|---|---|---|
| (A) CONVENTIONAL SETTING | ATTAINABLE VACUUM TRANSFER 0.1Pa OR LESS | $1.90 \times 10^{14}$ |
| (B) PRESENT EMBODIMENT SETTING | 133Pa | $3.70 \times 10^{13}$ |

$5.0 \times 10^{12}$ atoms/cm² (BEST DATA)

WITH ATTAINABLE VACUUM TRANSFER
INADEQUATE HSG FORMATION
(LACK OF SURFACE BUMPINESS)
DUE TO CONTAMINATION OF
WAFER SURFACE

WITH NITROGEN GAS SUPPLY: 0.5 slm, 50 Pa
ADEQUATE HSG FORMATION (VERY BUMPY SURFACE)

SEMICONDUCTOR MANUFACTURING METHOD, SUBSTRATE PROCESSING METHOD, AND SEMICONDUCTOR MANUFACTURING APPARATUS

BACKGROUND OF THE INVENTION

1. Field of the Invention

The present invention relates to a semiconductor manufacturing method, a substrate processing method, and a semiconductor manufacturing apparatus, and more particularly to a semiconductor manufacturing method, a substrate processing method, and a semiconductor manufacturing apparatus with which the effect of substrate contamination caused by impurities is minimized by adjusting the environment conditions in the transfer of the substrate from the preliminary chamber to the process chamber via the transfer chamber, or from the process chamber to the preliminary chamber.

2. Description of the Related Art

In addition to the problem of floating particulate (primarily mechanical contamination) that was restricted in the past, the problem of chemical contamination caused by gaseous particles has become more pronounced in recent years as semiconductor devices have become smaller and more highly integrated. The term "mechanical contamination" as used here refers to the generation of dust from mechanical moving parts such as a transfer robot, while "chemical contamination" (trace chemical components) refers to contamination caused by trace amounts of volatile impurity (out-gas) components coming from chamber structures (such as the shaft seals of a transfer robot or the O-rings used as chamber seals) or the reverse diffusion of oil from a vacuum pump.

One reason contamination has become such a problem is that in the HSG (Hemi-Spherical Grained silicon) formation technique discussed in Japanese Laid-Open Patent Application H5-304273 (U.S. Pat. No. 2,508,948), for example, contamination by gaseous particles results in inconsistent bonding density in the silicon molecules, which has an adverse effect on the quality of the finished product. In an epitaxial growth technique, the presence of chemical contaminants (impurity molecules) causes mismatching in the crystallinity of the silicon (the silicon in the portions where the contaminants are present grows irrespective of the crystallinity of the silicon substrate), resulting in crystal defects or polycrystallization, and this too has an adverse effect on the quality of the finished product. Also, in a process in which a thin film is formed by gate oxide film formation or the like, one molecule of contaminant accounts for a greater proportion of the total film thickness, so the effect on film thickness uniformity and the electrical characteristics of the device cannot be ignored.

In light of the above, a cleaner environment, in which not only mechanical contamination but also chemical contamination is removed, has been required in the manufacture of semiconductor devices in recent years, and should be provided in clean rooms and to manufacturing apparatus.

With a conventional semiconductor manufacturing apparatus comprising a load-lock chamber from and to which a substrate is exchanged with the outside, a process chamber in which the substrate is subjected to a predetermined processing such as thin film formation, and a transfer chamber in which the substrate is transferred between the load-lock chamber and the process chamber, when a wafer (substrate) is transferred from the load-lock chamber to the process chamber by a transfer robot inside the transfer chamber, the pressure inside the chambers is set under the vacuum that can be attained by vacuum pump exhaust, and this pressure is maintained at 0.1 Pa or less.

However, it is possible that a chamber kept in a vacuum state under the attainable vacuum may be contaminated by trace amounts of volatile impurity components from chamber structures (such as the shaft seals of a transfer robot or the O-rings used as chamber seals) or the reverse diffusion of oil from the vacuum pump, and there was the potential for this to have an adverse effect on the wafer during its transfer.

In view of this, the following methods have been attempted to prevent such chamber contamination.

(1) Lowering the impurity partial pressure in all of the chambers by installing a turbo molecular pump or other such pump capable of producing a super-high vacuum ($10^{-6}$ Pa) in all of the chambers.

(2) Designing the transfer robot inside the transfer chamber so that a super-high vacuum can be attained.

(3) Using metal O-rings for the chamber seals.

The downside to these methods, however, was their high cost, difficulty of maintenance, and so forth.

In Japanese Laid-Open Patent Application H6-104178 (hereinafter referred to as known example) is proposed a method in which a substrate is vacuum treated using a plurality of vacuum process chambers, a transfer chamber with a built-in transfer robot for transferring the substrate, and an entry chamber and exit chamber for bringing the substrate in and out, wherein the transfer chamber is evacuated to vacuum, after which an inert gas such as nitrogen gas is continuously introduced into the transfer chamber during the operation of the apparatus, or the gas used in the vacuum processing is continuously introduced into the vacuum process chamber during the operation of the apparatus. This mainly prevents contamination through the elimination of dust generated from the transfer robot, that is, mechanical contamination, by supplying and exhausting an inert gas to and from the vacuum process chamber and the transfer chamber (excluding the entry and exit chambers) during substrate transfer. Since the inert gas is supplied and exhausted to and from the transfer chamber and vacuum process chamber (excluding the entry and exit chambers), it is believed to be possible to eliminate the above-mentioned chemical contamination at least in the transfer chamber and vacuum process chamber.

With this known example, however, even though the entry and exit chambers have a vacuum pump, the inert gas is only exhausted, and not supplied, so it is impossible to prevent contamination caused by trace amounts of volatile impurity components coming from chamber structures (such as the shaft seals of a transfer robot or the O-rings used as chamber seals) or the reverse diffusion of oil from a vacuum pump. Therefore, the entry and exit chambers, and in turn the entire semiconductor manufacturing apparatus, cannot be maintained in a clean state, and the contamination of the substrate surface cannot be effectively prevented.

Also, with the known example, the substrates are introduced into the entry and exit chambers directly in single units, rather than with a cassette that holds a plurality of substrates, but when a cassette that holds a plurality of substrates is used, the substrate is always present in the entry and exit chambers, even while the substrate is being transferred to the process chamber or transfer chamber after cassette insertion, so even though the entry and exit chambers are exhausted, the substrate present in the entry and exit chambers can still end up being contaminated by reverse diffusion of oil from the vacuum pump or other such chemical contamination.

SUMMARY OF THE INVENTION

In light of the above situation, it is an object of the present invention to provide a semiconductor manufacturing method, a substrate processing method, and a semiconductor manufacturing apparatus with which not only the transfer chamber and the process chamber but the preliminary chamber can be maintained in a clean state, allowing the substrate transfer environment to be adjusted to prevent contamination of the substrate surface by impurities, and affording low cost and easy maintenance.

The semiconductor manufacturing method of the first invention comprises the steps of exchanging a substrate between a preliminary chamber and the outside, subjecting the substrate to a predetermined processing in a process chamber, transferring the substrate through a transfer chamber provided between the preliminary chamber and the process chamber, and supplying and exhausting an inert gas to and from at least the chamber in which the substrate is present among the chambers during the transfer of the substrate. The predetermined processing may be any processing treating a gas in the manufacture of a semiconductor element, such as vapor phase growth. Supplying and exhausting an inert gas to and from at least the chamber in which the substrate is present during the transfer of the substrate allows a predetermined gas flow to be formed within at least the chamber in which the substrate is present, and by maintaining this chamber in a predetermined pressure state and transferring the substrate under this pressure, chemical contamination can be effectively prevented in at least the chambers in which the substrate is present, and contamination of the substrate surface during its transfer can be minimized.

The semiconductor manufacturing method of the second invention comprises the steps of exchanging a substrate between a preliminary chamber and the outside, subjecting the substrate to a predetermined processing in a process chamber, transferring the substrate through a transfer chamber provided between the preliminary chamber and the process chamber, and supplying and exhausting an inert gas to and from all of the chambers during the transfer of the substrate. It is preferable for an inert gas to be supplied to and exhausted from all of the chambers because a predetermined gas flow can be formed within all the chambers, chemical contamination can be prevented more effectively, and transfer will be more efficient.

The semiconductor manufacturing method of the third invention comprises the steps of exchanging a substrate between a preliminary chamber and the outside, subjecting the substrate to a predetermined processing in a process chamber, transferring the substrate through a transfer chamber provided between the preliminary chamber and the process chamber, and supplying and exhausting an inert gas to and from at least the chamber equipped with a vacuum pump among the chamber during the transfer of the substrate. Since an inert gas is supplied to and exhausted from at least the chamber equipped with a vacuum pump during the transfer of the substrate, and a gas flow is formed, reverse diffusion of oil from the vacuum pump can be effectively prevented.

In the first invention above, it is preferable for the exchange of the substrate between the preliminary chamber and the outside to be carried out with a cassette that holds a plurality of substrates. If a cassette that holds a plurality of substrates, rather than a single substrate, is transferred into the preliminary chamber, then after this cassette transfer a substrate will be present in the preliminary chamber even during substrate transfer, so when preventing chemical contamination is taken into account, inert gas must be supplied and exhausted to and from the preliminary chamber at all times. In this respect, with the present invention inert gas is supplied to and exhausted from the preliminary chamber, which is one of the chambers in which a substrate is present, so contamination of the substrate surface present at all times in the preliminary chamber can be minimized.

Also, in the first invention, it is preferable for the predetermined processing to which the substrate is subjected in the process chamber to be HSG formation or epitaxial growth. In an HSG formation process, the pressure inside the chamber which should be maintained is higher than in the past, with at least 50 Pa being preferable, for example, in an epitaxial growth process, it is preferable for the pressure inside the chamber which should be maintained is about 400 to 1333 Pa, for example. With an HSG formation process, contamination by gaseous particles results in non-uniform dangling bond density of the silicon molecules, and with an epitaxial growth process, the presence of chemical contaminants causes mismatching in the crystallinity of the silicon, resulting in crystal defects or polycrystallization, and this has an adverse effect on the quality of the finished product, but with the present invention, this effect can be reduced because an inert gas is supplied to and exhausted from the chamber in which the substrate is present. With a process in which a film thickness is made smaller such as a formation process of a gate oxide film or the like, a proportion for which one molecule of contaminant accounts on the total film thickness becomes large, so the effect on the film thickness uniformity and the characteristics of the device cannot be ignored, but here again, this effect can be reduced with the present invention.

The substrate processing method of the fourth invention comprises the steps of exchanging a substrate between a preliminary chamber and the outside, subjecting the substrate to a predetermined processing in a process chamber, transferring the substrate through a transfer chamber provided between the preliminary chamber and the process chamber, and supplying and exhausting an inert gas to and from at least the chamber in which the substrate is present among the chambers during the transfer of the substrate. The substrate may be a glass substrate, as well as a semiconductor substrate. The predetermined processing may be any processing treating a gas in the processing of the substrate, such as a process of vapor phase growth. Since an inert gas is supplied to and exhausted from at least the chamber in which the substrate is present during the transfer of the substrate, chemical contamination can be effectively prevented in at least the chamber in which the substrate is present, and contamination of the substrate surface during transfer can be minimized.

The semiconductor manufacturing apparatus of the fifth invention comprises a preliminary chamber from and to which a substrate is exchanged with the outside, a process chamber in which the substrate is subjected to a predetermined processing, a transfer chamber in which the substrate is transferred between the preliminary chamber and the process chamber by a built-in transfer robot, inert gas supply portion provided to each of the chambers that supplies an inert gas into the corresponding chamber, gas exhaust portion provided to each of chambers that exhausts the gas from the corresponding chamber, and controller that controls the inert gas supply portion and gas exhaust portion and thereby supplying and exhausting an inert gas to and from at least the chamber in which the substrate is present during the transfer of the substrate. The predetermined processing may be any processing treating a gas in the manufacture of a semiconductor element, such as a process of vapor phase growth. Chemical contamination can be effectively prevented in at least the chamber in which the substrate is present, and contamination of the substrate surface during transfer can be minimized with a simple structure merely entailing the provision of controller that supplies and exhausts an inert gas to and from at least the chamber in which the substrate is present during the transfer of the substrate.

In the fifth invention above, it is preferable for the preliminary chamber to be a cassette chamber into which is transferred a cassette that holds a plurality of substrates. If the preliminary chamber is a cassette chamber into which is transferred a cassette that holds a plurality of substrates, rather than a single substrates then after this cassette transfer a substrate will be present in the preliminary chamber even during substrate transfer, so when preventing chemical contamination is taken into account, inert gas must be supplied and exhausted to and from the preliminary chamber at all times in this respect, with the present invention inert gas is supplied to and exhausted from the preliminary chamber, which is one of the chambers in which a substrate is present, so contamination of the substrate surface present at all times in the preliminary chamber can be minimized.

DESCRIPTION OF THE PREFERRED EMBODIMENTS

Embodiments of the present invention will now be described through reference to the drawings.

Figure 1:
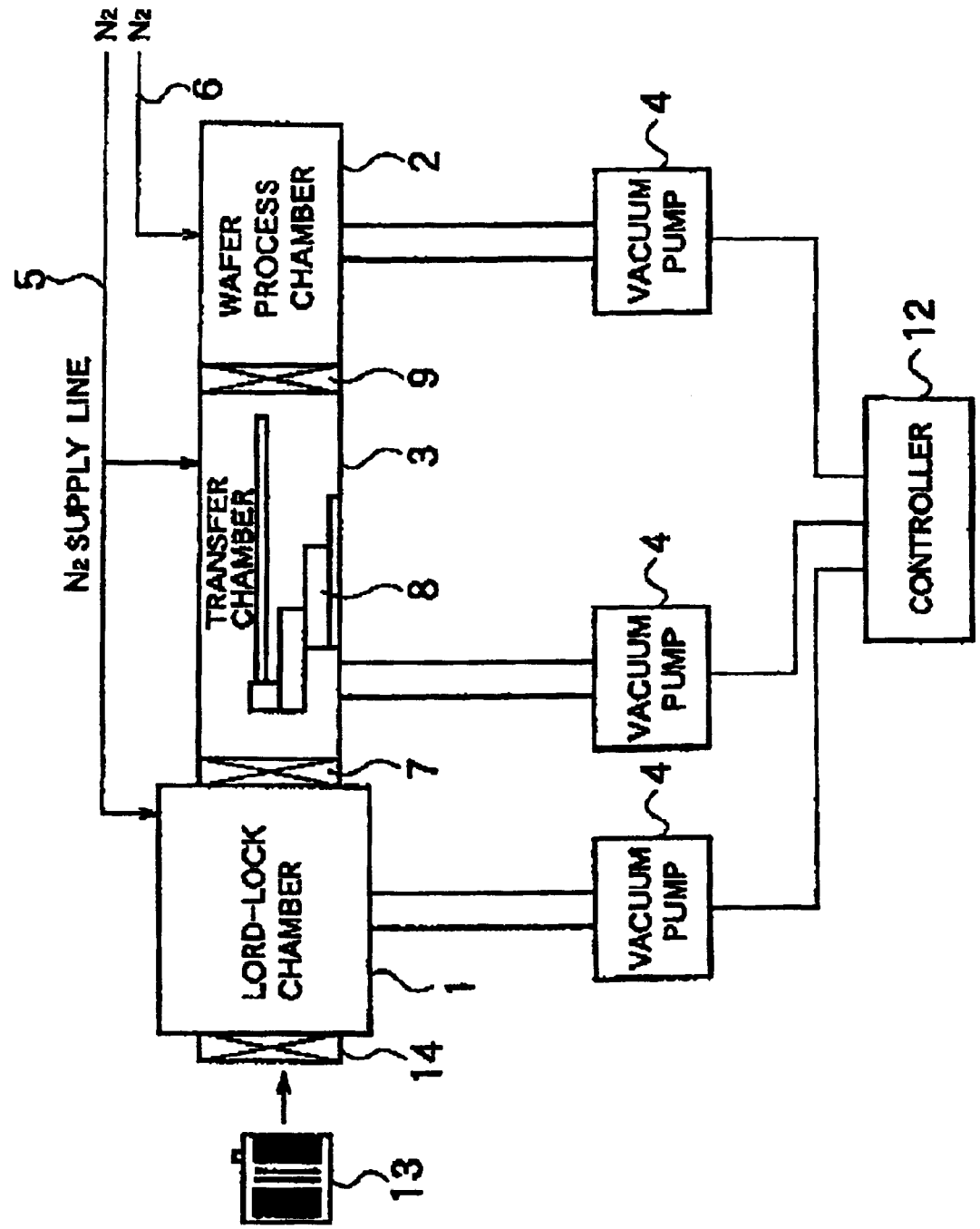
FIG. 1 is a simplified diagram of a semiconductor manufacturing apparatus for implementing the semiconductor manufacturing method and substrate processing method pertaining to embodiments of the present invention.

FIG. 1 is a simplified diagram of a semiconductor manufacturing apparatus for implementing the semiconductor manufacturing method pertaining to embodiments of the present invention. This semiconductor manufacturing apparatus comprises a load-lock chamber 1 which serves as a preliminary chamber in which wafer (substrate) exchange with the outside is performed, a wafer process chamber 2 in which the wafer is subjected to a predetermined processing, and a transfer chamber 3 in which the wafer is transferred between the load-lock chamber 1 and the wafer process chamber 2. The transfer chamber 3 is equipped with a transfer robot 8 for transferring wafers, the predetermined processing may include HSG formation, epitaxial growth, vapor phase growth (formation of a thin film by CVD), formation of an oxide film, diffusion, etching, and so forth. The preliminary chamber may be an $N_2$ purge box or the like instead of a load-lock chamber.

The load-lock chamber 1, the wafer process chamber 2, and the transfer chamber 3 are designed to be vacuum evacuated by separate vacuum pumps (gas exhaust portion) 4. The load-lock chamber 1 is openably separated from the transfer chamber 3, and the transfer chamber 3 from the wafer process chamber 2, by gate valves 7 and 9, respectively.

The load-lock chamber 1 and the transfer chamber 3 are connected to an $N_2$ supply line 5 so that $N_2$ gas (inert gas) can be supplied. Similarly, the wafer process chamber 2 is connected to an $N_2$ supply line 6 so that $N_2$ gas can be supplied. A controller 12 is provided for controlling the $N_2$ gas lines and the vacuum pumps 4 in the transfer of the wafers between the load-lock chamber 1 and the wafer process chamber 2, and thereby supplying and exhausting $N_2$ gas to and from specific chambers from among the load-lock chamber 1, the transfer chamber 3, and the wafer process chamber 2 and maintaining a predetermined pressure inside this specific chamber. The term "specific chambers" refers to at least the chambers in which the substrate is present during wafer transfer. While the wafer is being transferred from the load-lock chamber 1 to the transfer chamber 3, for instance, this would be the load-lock chamber 1 and the transfer chamber 3, and while the wafer is being transferred from the transfer chamber 3 to the wafer process chamber 2, this would be the transfer chamber 3 and the wafer process chamber 2. Naturally, the specific chambers may be all the chambers, as this actually allows mechanical contamination to be prevented more effectively, and is also desirable in terms of transfer efficiency. The specific chambers may also be all of the chambers equipped with a vacuum pump. It is also preferable for $N_2$ gas to be supplied to and exhausted from the chambers when the wafer is not being transferred and there are no wafers in the chambers, since this will keep the insides of the chambers in a clean state. It is also preferable for gas to be supplied and exhausted at all times in the vacuum evacuation of the chambers by the vacuum pumps, whether during wafer transfer or otherwise, so that a gas flow will be formed from upstream to downstream with respect to the vacuum pumps.

When a specific wafer processing process is conducted in this semiconductor manufacturing apparatus, in the transfer of the wafer from the load-lock chamber 1 to the wafer process chamber 2, all of the chambers (the load-lock chamber 1, transfer chamber 3, and the wafer process chamber 2) are exhausted by the vacuum pumps 4 while $N_2$ gas is being supplied, and the load-lock chamber 1, the transfer chamber 3, and the wafer process chamber 2 are maintained at a predetermined pressure. The wafer is transferred while the load-lock chamber 1, the transfer chamber 3, and the wafer process chamber 2 are maintained at this predetermined pressure.

In more specific terms, of the closed gate valves 14, 7, and 9, first the gate valve 14 (for exchange with the outside) is opened, a cassette 13 holding a plurality of wafers is transferred into the load-lock chamber 1, and the gate valve 14 is closed. After this, the load-lock chamber 1 is vacuum evacuated to the attainable vacuum pressure, after which an inert gas (such as $N_2$) is introduced into and exhausted from the load-lock chamber 1 so that the load-lock chamber 1 is at the transfer pressure. Thereafter, at least while the cassette 13 (that is, the wafers) is present in the load-lock chamber 1, the inert gas continues to be supplied to and exhausted from the load-lock chamber 1, so that the inside of the load-lock chamber 1 is kept at a constant pressure. The wafer process chamber 2 and the transfer chamber 3 are adjusted in advance by the introduction and exhaust of inert gas, so that the pressure inside the transfer chamber 3 is maintained at the transfer pressure. As for the wafer process chamber 2, this state is maintained except during wafer processing, while this state is maintained for the transfer chamber 3 during operation of the apparatus. At the point when the pressure inside the load-lock chamber 1 is equal to the pressure inside the transfer chamber 3, that is, the transfer pressure, the gate valve 7 is opened, a wafer is transferred to the transfer chamber 3, and the gate valve 7 is closed. After this, at the point when the pressure inside the transfer chamber 3 is equal to the pressure inside the wafer process chamber 2, the gate valve 9 is opened, a wafer is transferred to the wafer process chamber 2, the gate valve 9 is closed, and the wafer is treated. After wafer processing, the wafer is transferred by the opposite procedure as that given above.

Doing this effectively prevents the reverse diffusion of oil from the vacuum pumps 4 to the load-lock chamber 1, the wafer process chamber 2, and the transfer chamber 3, and also suppresses the volatilization of impurities from chamber structures (such as the shaft seals of a transfer robot or the O-rings used as chamber seals), and as a result, the effect of contamination caused by impurities can be minimized and the processing quality of the wafers enhanced.

Figure 2:
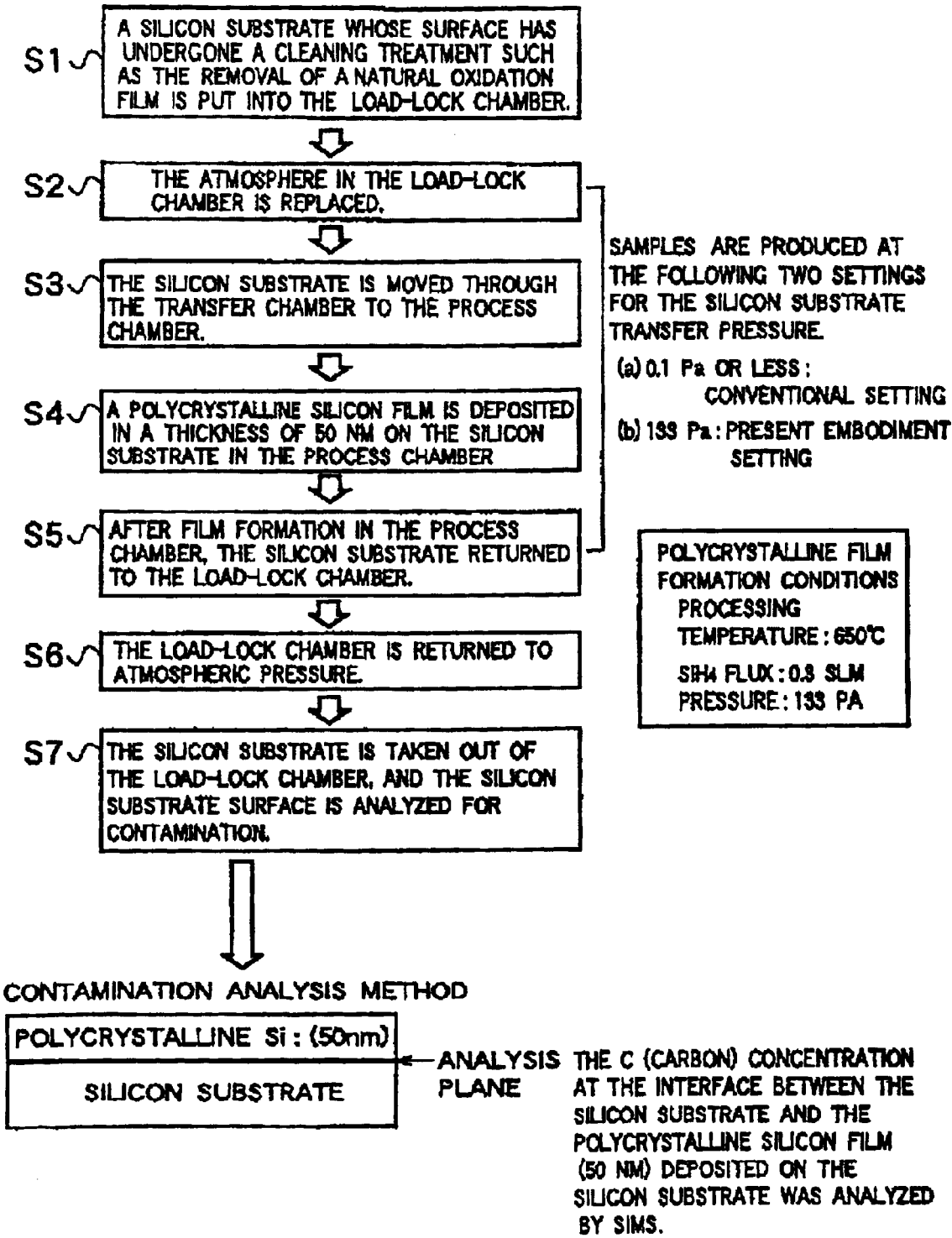
FIG. 2 is a flow chart of the production of a contamination analysis sample.
Figure 3:
FIG. 3 is a table showing contamination analysis results comparing conventional conditions and the present invention conditions.

In order to test the effect of this embodiment, the above-mentioned semiconductor manufacturing apparatus was used to deposit a polycrystalline silicon film on a silicon substrate, and contamination analysis was conducted at the interface thereof. FIG. 2 is a flow chart of producing a sample for this contamination analysis, while FIG. 3 shows the results of the contamination analysis. The object of the contamination analysis was carbon (C), assuming an organic substance with a high likelihood of becoming an out-gas component from a structural member or the oil in the vacuum pumps. The steps in FIG. 2 are described below.

S1: A silicon substrate whose surface has undergone a cleaning processing such as the removal of a natural oxidation film is put into the load-lock chamber.

S2: The atmosphere in the load-lock chamber is replaced.

S3: The silicon substrate is moved through the transfer chamber to the process chamber.

S4: A polycrystalline silicon film is deposited in a thickness of 50 nm on the silicon substrate in the process chamber. The polycrystalline film formation conditions are as follows.

| | |
|---|---|
| Processing temperature: | 650° C. |
| $SiH_4$ flux: | 0.3 slm |
| Pressure: | 133 Pa |

S5: After film formation in the process chamber, the silicon substrate is returned to the load-lock chamber.

In the above steps S2 to S5, samples are produced at the following two settings for the silicon substrate transfer pressure.

(a) 0.1 Pa or less: conventional setting (under the attainable vacuum resulting from evacuation by the vacuum pumps)

(b) 133 Pa: present embodiment setting ($N_2$ gas exhausted while being introduced)

S6: The load-lock chamber is returned to atmospheric pressure.

S7: The silicon substrate is taken out of the load-lock chambers and the silicon substrate surface is analyzed for contamination. The contamination analysis method involved using SIMS (Secondary Ion Mass Spectroscopy) to analyze the carbon concentration at the interface (analysis plane) between the silicon substrate and the polycrystalline silicon film (50 nm) deposited on the silicon substrate in the above steps.

As seen in FIG. 3, the carbon concentration at (a) a conventional setting and (b) the setting in this embodiment is (a) $1.90 \times 10^{14}$ atons/$cm^2$ and (b) $3.70 \times 10^{13}$ atoms/$cm^2$, indicating that the use of the setting in this embodiment tends to reduce contamination by about one order of magnitude as compared to when the conventional setting is used. According to the ITRS (International Technology Roadmap of Semiconductors) published in 1999 in regard to this, the standard for organic substances on treated substrates was predicted to be $4.10 \times 10^{13}$ or less with 100-nm devices in the year 2005, so the present embodiment, in which the amount of organic substances was reduced from $1.90 \times 10^{14}$ atoms/$cm^2$ to $3.70 \times 10^{11}$ atoms/$cm^2$, is clearly superior.

It has also been stated in publications that the amount of organic substances must be standardized at $1.0 \times 10^{13}$ atoms/$cm^2$ or less.

Results have also been obtained indicating that the best carbon concentration data obtained through processing under the conditions of this embodiment (introducing and exhausting $N_2$ gas) is $5.0 \times 10^{12}$ atoms/$cm^2$. This means it is possible that this embodiment will satisfy this standard for organic substances. Furthermore, while there is a slight discrepancy in the two pieces of data given above and obtained by processing using the conditions of this embodiment, this can be attributed to the fact that variance occurs in the measurement values depending on the measurement environment and on the measurement method in the measurement of the same wafer.

The reason this embodiment is thus able to satisfy the specified standard is that an inert gas is introduced into and exhausted from all of the chambers having vacuum pumps (the process chamber, transfer chamber, and load-lock chamber), and not only mechanical contamination, but also chemical contamination caused by trace amounts of volatile impurity (out-gas) components coming from chamber structures or the reverse diffusion of oil from a vacuum pump can be effectively eliminated from the entire semiconductor manufacturing apparatus. In this respect, with the method of the known example, whose primary object was to prevent the generation of dust from mechanical moving parts (mechanical contamination), the entry and exit chambers were excluded from the chambers into and from which the inert gas was introduced and exhausted, so the effective elimination of chemical contamination could not be achieved. In contrast, with this embodiment, since the inert gas is introduced into and exhausted from the load-lock chamber as well, the above-mentioned standard can be satisfied for all of the plurality of wafers held in a cassette present in the load-lock chamber during wafer transfer or processing.

Also, with this embodiment, since the inert gas is supplied to and exhausted from all of the chambers, which prevents the reverse diffusion of oil from the vacuum pumps, there is no need to provide each chamber with a turbo molecular pump that has little reverse diffusion of oil, or to modify the members inside the transfer chamber (such as using metal O-rings), or to employ means for lowering the partial pressure of impurities in the transfer space by using a super-high vacuum of about $10^{-8}$ Pa. Therefore, there is no need to raise the pressure of the process chamber up to the film formation pressure, and there is none of the attendant decrease in throughput. As a result, the cost is low and maintenance is easy with this embodiment.

Next, a semiconductor manufacturing apparatus and semiconductor manufacturing method for forming an HSG film on a substrate on the surface of which is formed an amorphous silicon film serving as a capacitance electrode will be described as specific examples. HSG refers to markedly protruding hemispherical crystal grains formed on the film surface. A film on which this HSG has been formed has a large surface area, which ensures a large capacity. A known technique for forming HSG is discussed, for example, in the above-mentioned Japanese Laid-Open Patent Application H5-304273 (U.S. Pat. No. 2,508,948).

Figure 4:
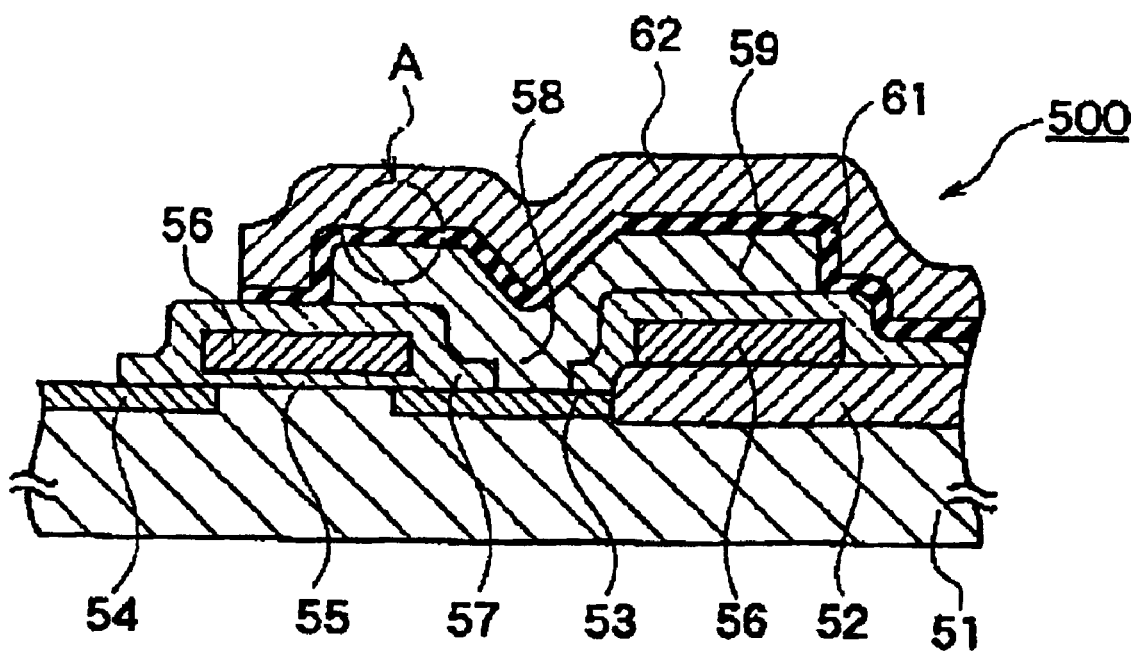
FIG. 4 is a cross section of a DRAM chip equipped with a capacitor cell.

First, we will describe a method for manufacturing a semiconductor device including the above-mentioned HSG film. A method for manufacturing a DRAM 500 equipped with a capacitor cell, to which the present invention can be favorably applied, will be described through reference to FIGS. 4 and 5. In FIG. 4, a field oxide film 52 is formed on the surface of a silicon substrate 51, forming a plurality of separate transistor formation regions. A gate oxide film 55 is formed in each transistor formation region, over which a gate electrode 56 is formed. The gate electrode 56 and the field oxide film 52 are used as masks, impurities are introduced into the surface of the silicon substrate 51 by ion implantation, and a source 53 and a drain 54 are self-matchingly formed. After this, an interlayer insulating film 57 is formed, and then a contact hole 58 that exposes the source 53 is formed in the interlayer insulating film 57.

Figure 5:
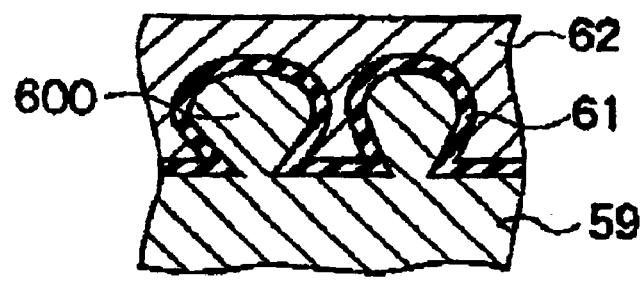
FIG. 5 is an enlarged detail view of FIG. 4.

Next, an amorphous silicon film is deposited over the interlayer insulating film 57, this is patterned, the natural oxide film of the amorphous silicon film is removed, polycrystallization is performed, and a capacitive lower electrode 59 is formed. As shown in FIG. 5, in this polycrystallization processing, markedly protruding hemispherical crystal grains (HSG) 600 are formed on the surface of the amorphous silicon film, thereby increasing the surface area of the capacitive lower electrode 59. A capacitive insulating film 61 composed of $Ta_2O_5$ is then formed, over which a capacitive upper electrode 62 is formed from a polycrystalline silicon film or the like. The result of this is a DRAM in which a capacitor cell is connected to the source 53 of an MOS transistor.

Figure 6:
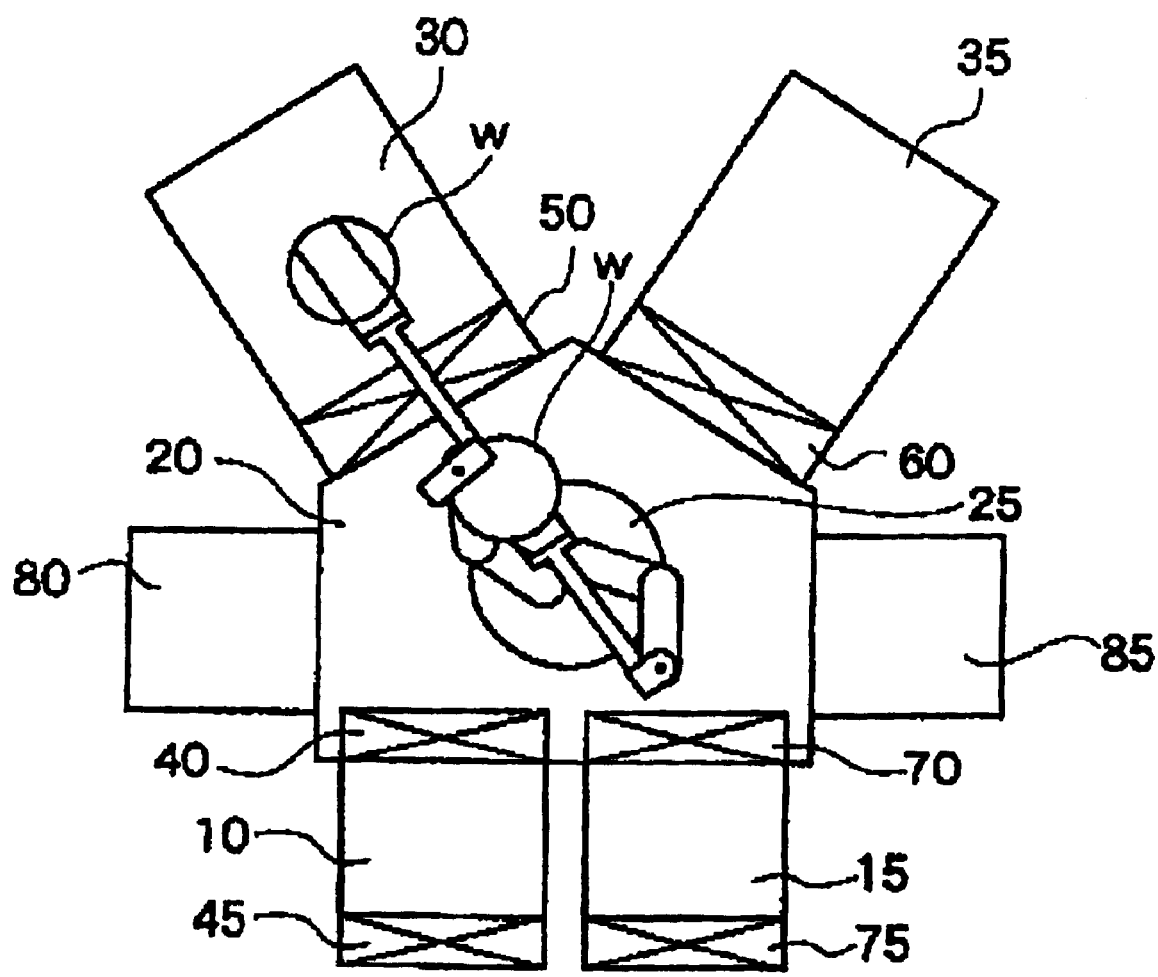
FIG. 6 is a simplified plan view of a semiconductor manufacturing apparatus for implementing an HSG formation process pertaining to an embodiment of the present invention.
Figure 7:
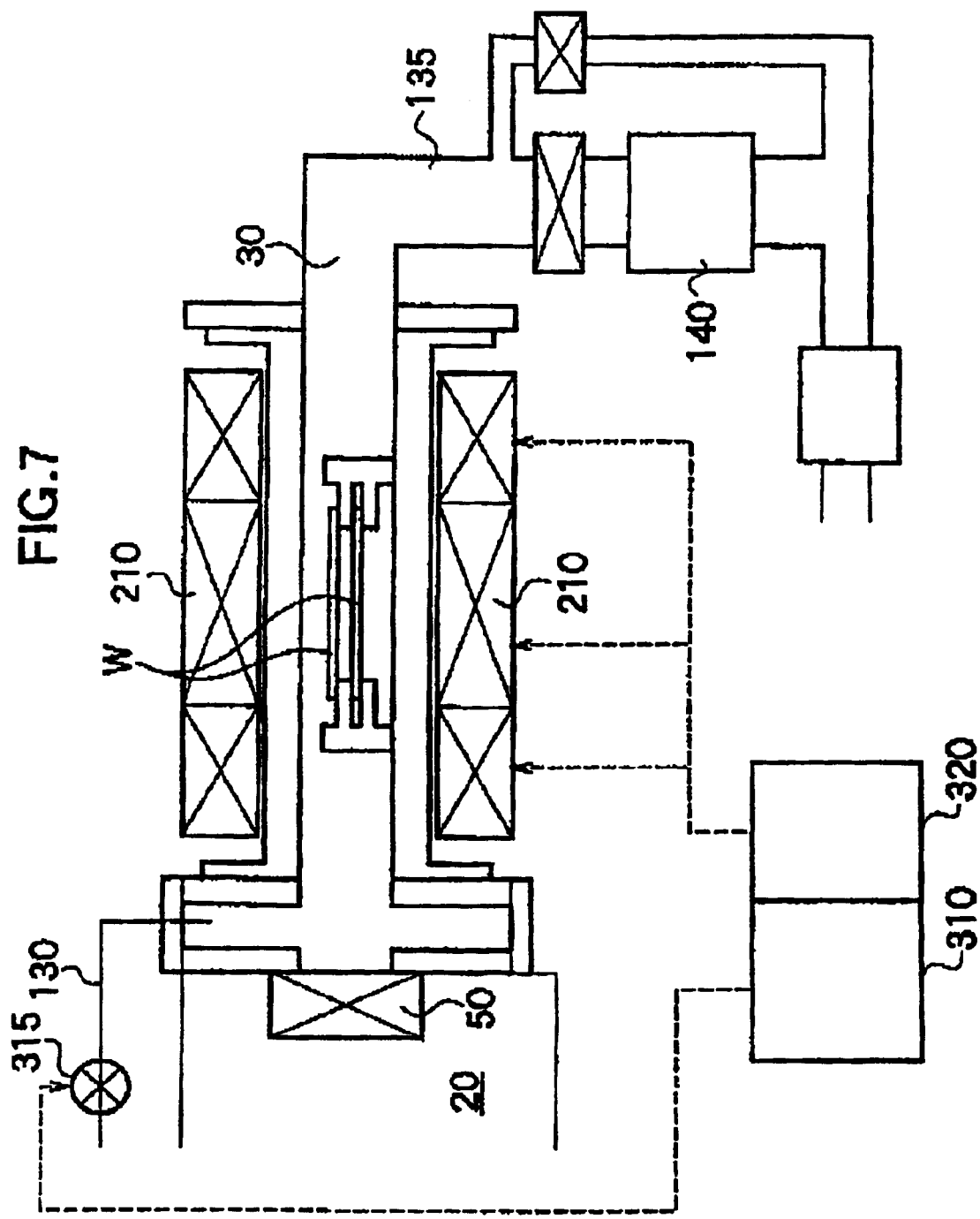
FIG. 7 is a vertical cross section of a reaction chamber within the semiconductor manufacturing apparatus of FIG. 6.

FIG. 6 is a plan view of a semiconductor manufacturing apparatus for forming an HSG film, and FIG. 7 is a vertical cross section of a reaction chamber within the semiconductor manufacturing apparatus.

In FIG. 6, which shows a semiconductor manufacturing apparatus, 20 is a transfer chamber, and a first load-lock chamber 10, a first cooling chamber 80, a first reaction chamber 30, a second reaction chamber 35, a second cooling chamber 85, and a second load-lock chamber 15 that constitute a plurality of vacuum chambers are provided radially around the periphery of this transfer chamber 20. Gate valves 40, 50, 60, and 70 are provided between the transfer chamber 20 and the first load-lock chamber 10, the first reaction chamber 30, the second reaction chamber 35, the second load-lock chamber 15, respectively. A wafer transfer robot 25 is installed in the transfer chamber 20. With this semiconductor manufacturing apparatus, the first reaction chamber 30 and the second reaction chamber 35 correspond to the "process chamber" referred to in the present invention.

In FIG. 7, which shows a reaction chamber, the first reaction chamber 30, which is linked to the transfer chamber 20 via the gate valve 50, has a nozzle 130 for supplying monosilane gas ($SiH_4$) to the gas system needed for film formation, and a super-high vacuum is achieved by drawing in the gas in a single direction with a turbo molecular pump 140 via an exhaust pipe 135 facing in the opposite direction from the nozzle 130 with respect to a wafer W. A flux control valve 315 is provided to the pipe leading to the $SiH_4$ supply nozzle 130, and this flux control valve 315 is controlled by a flux controller 310 so that the flux of the $SiH_4$ gas supplied into the first reaction chamber 30 is the specified flux.

Wafer in-plans uniformity can be ensured with good selectivity by having the monosilane flow in a single direction with respect to the wafer plane. This is because monosilane is used, which has a lower growth rate than disilane and makes it easier to control HSG formation.

If the reaction chamber pressure is low (0.5 Pa or less), the gas flow will be faster, and wafer in-plane uniformity will be better due to sufficient surface reaction rate limiting at 600 to 620° C. Also, the construction of the reaction chamber 30 is such that the wafers are heated above and below by a split resistance heater 210 that faces the wafer W surface, the result being that it is easier to ensure temperature uniformity within the wafer plane in a abort time. The split resistance heater 210 is controlled by a temperature controller 320 so that the temperature inside the first reaction chamber 30 will be the specified temperature, namely, any temperature between 600 and 620° C.

A method for treating wafers using the above-mentioned semiconductor manufacturing apparatus will now be described. First, before the wafers on which an amorphous silicon film has been formed at a specific capacitive electrode portion of the semiconductor chip that serves as the semiconductor element are transferred into the above-mentioned semiconductor manufacturing apparatus, a natural oxide film or a chemical oxide film formed by a mixture of $NH_4OH+H_2O_2+H_2O$ is washed away with a dilute hydrofluoric acid aqueous solution, for example, after which a drying processing is performed with a spin dryer or the like. The specific capacitive electrode portion is generally the lower electrode portion connected to the source/drain region of a MOS transistor. After drying, a gate valve 45 is opened in the load-lock chamber 10 inside the semiconductor manufacturing apparatus shown in FIG. 6, wafers are quickly transferred into the chamber 10 in cleaned cassette units, and the gate valve 45 is closed. The reason for transferring while clean is to prevent the re-formation of natural oxide film or contamination by the atmosphere in the clean room, and the transfer up to the load-lock chamber 10 must be carried out quickly. At this point, if there is a large amount of contamination, natural oxide film, or the like adhering to or formed on the amorphous silicon surface, there will be a difference in the silicon bonding density between the state of the amorphous silicon surface and the state of the natural oxide film surface deposited over the amorphous silicon, for instance, so there will be no HSG formation, or there will be variance in the HSG formation state, namely, the HSG particle size and density, which leads to a lower semiconductor device yield.

After the cassette holding a plurality of wafers has been transferred into the load-lock chamber 10 as above, the load-lock chamber 10 is vacuum evacuated to the attainable vacuum pressure, after which high-purity nitrogen ($N_2$) is supplied into and exhausted from the load-lock chamber 10 (hereinafter this will be referred to as purging) to bring the inside of the load-lock chamber 10 to the transfer pressure. Thereafter, at least while the cassette (that is, the wafers) is present in the load-lock chamber 10, the introduction and exhaust of $N_2$ gas into and from the load-lock chamber 10 is continued so as to maintain the load-lock chamber 10 at a predetermined pressure.

The reason for exhausting the high-purity nitrogen ($N_2$) while it is supplied here is to provide a vapor flow by purging and prevent contamination by trace amounts of volatile impurity components from chamber structures or the reverse diffusion of oil from the vacuum pumps. The purpose of purging with dry nitrogen ($N_2$) is to make sure that water will thoroughly saturate the atmosphere. This is also because sudden depressurization will not cause all of the water (liquid) adhering to the wafer surfaces, the cassette, and so forth to become steam (vapor), and actually when part of the water becomes a vapor, the resulting loss of heat lowers the temperature to the point that the water turns into ice (solid), and using dry nitrogen also prevents this. The ice melts into water after being transferred through the reaction chamber 30, and can cause part of the surface to oxidize, hampering HSG formation. It is also effective to replace as much of the remaining substances as possible by raising the pressure inside the load-lock chamber 10 several times.

The inside of the reaction chambers 30 and 35 and the transfer chamber 20 are first put in a state in which $N_2$ gas is being introduced and exhausted so as to maintain the pressure inside the transfer chamber 20 at the transfer pressure. This state is maintained for the reaction chambers 30 and 35 except during wafer processing, and is maintained for the transfer chamber 20 throughout apparatus operation.

At the point when $N_2$ gas has been introduced into and exhausted from the load-lock chamber 10 until the pressure inside the load-lock chamber 10 is equal to the pressure inside the transfer chamber 20, that is, the transfer pressure, the gate valve 40 is opened, a wafer W is transferred by the wafer transfer robot 25 to the transfer chamber 20, and the gate valve 40 is closed. Then, at the point when the pressure inside the transfer chamber 20 is equal to the pressure inside the process chamber 30, the gate valve 50 is opened, the wafer W is transferred into the process chamber 30, the gate valve 50 is closed, and the wafer W is treated. Following this wafer processing, the wafer W is transferred by the opposite procedure as that given above. Nitrogen ($N_2$) is supplied to and exhausted from the load-lock chamber 10, the transfer chamber 20, and the reaction chamber 30 at all times to keep impurity substances present or generated in the load-lock chamber 10, the transfer chamber 20, and the reaction chamber 30 from adhering to the wafer surface. Specifically, each chamber is prevented from being contaminated by trace amounts of volatile impurity components from chamber structures (such as the shaft seals of the transfer robot or the O-rings used as chamber seals) or the reverse diffusion of oil from the vacuum pump.

With an apparatus such as this, no pump capable of producing a super-high vacuum ($10^{-6}$ Pa) is used except in the reaction chambers. This is because supplying and exhausting $N_2$ gas to and from the load-lock chamber and the transfer chamber during transfer as above allows the wafer surface to be transferred to the reaction chambers while its surface is still clean, so there is no need for a pump capable of producing a super-high vacuum other than in the reaction chamber 30. This not only makes the apparatus less expensive, but also shortens the processing time.

The process carried out in the reaction chambers will now be described.

The temperature of the wafer W transferred to the reaction chamber 30 stabilizes at 600 to 620° C., which is the preset reaction chamber temperature. The stabilization of the temperature is performed in a atmosphere consist of a high vacuum or in a atmosphere consist of a non-reactive gas that will not react with the amorphous silicon surface, such as an inert gas involving nitrogen gas. When temperature stabilization and crystallization are both taken into account, though, it is preferable for the temperature stabilization time to be about 5 minutes so that the in-plane temperature stabilization of the wafer and the polycrystallization of the underlying amorphous silicon will not hamper HSG formation. Thereafter, the above-mentioned reaction chamber temperature is maintained.

When the above-mentioned atmosphere is a non-reactive gas atmosphere, after it has been thoroughly removed, monosilane is allowed to flow in at a rate of 150 to 200 cc per minute for 2 to 2.5 minutes to form (generate) fine crystal nuclei on the amorphous silicon surface. The density of these crystal nuclei tends to increase along with wafer temperature and nucleation time, and when the monosilane flux is small, the nucleation time has to be increased.

Finally, the supply of monosilane is stopped, and crystal grains are formed by growing the crystal nuclei formed on the amorphous silicon surface by migration of the silicon atoms. The size of these crystal grains tends to increase along with grain growth time, with growth being substantially maximized after 5 minutes, so the time is adjusted to between 3 and 5 minutes. If this time is too long, the grains will bond together into larger grains, decreasing the rate of increase in surface area that is the object of the present invention, so the time must be limited. The reason the term "substantially" is used above is that the time at which growth is maximized will vary with the growth conditions.

As a specific example, HSG with good wafer in-plans uniformity and stable, selective HSG formation was achieved by employing the above-mentioned specific conditions, such as a reaction chamber temperature of 610° C. a temperature stabilization time of 5 minutes, a monosilane ($SiH_4$) flow of 200 sccm, a nucleation time of 2 minutes, and a grain growth time of 3 minutes. Similar results were obtained at a reaction chamber temperature of 610° C., a temperature stabilization time of 5 minutes, a monosilane ($SiH_4$) flow of 150 seam, a nucleation time of 2.5 minutes, and a grain growth time of 5 minutes. Treating under the above conditions also allows the number of wafers treated per unit of time to be 20/hr, allows the number of wafers treated per unit of time to be increased over the number treated in a vertical apparatus process (16/hr), and increases throughput.

Figure 8:
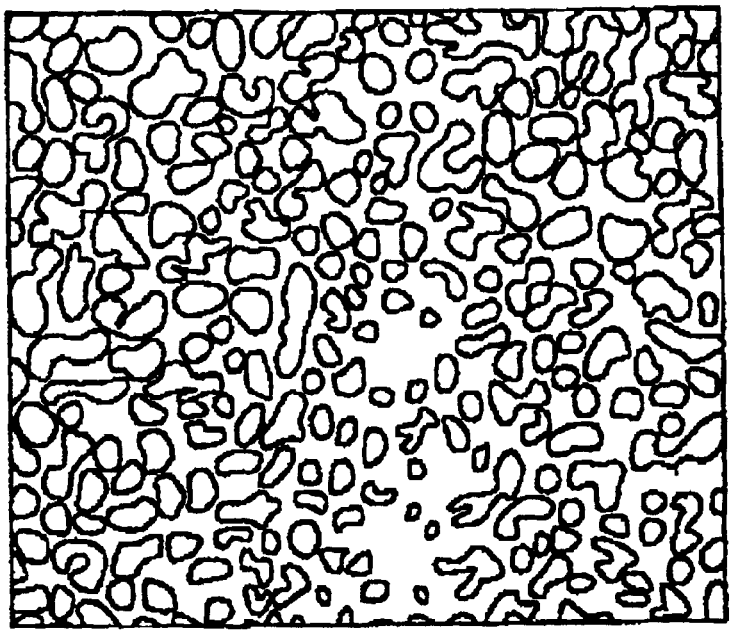
FIG. 8 is a drawing of an SEM photograph of a wafer after an HSG formation process when the present invention is not implemented, which has been copied so as to make the diagram easier to understand.
Figure 9:
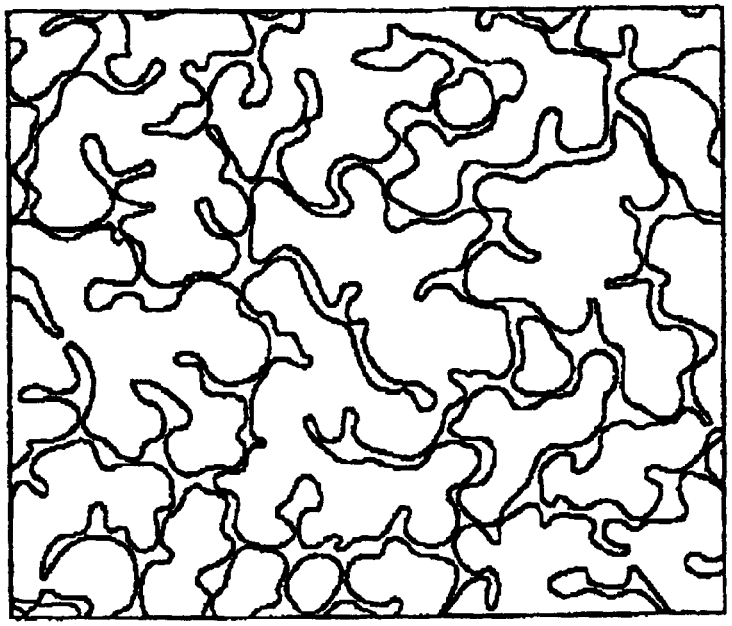
FIG. 9 is a drawing of an SEM photograph of a wafer after an HSG formation process when the present invention is implemented, which has been copied so as to make the diagram easier to understand.

In the HSG formation process, FIG. 8 is a drawing of an SEM (Scanning Electron Microscope) photograph of when the wafer was transferred under the attainable vacuum (conventional example), and FIG. 9 when the wafer was transferred under nitrogen purging (specific example of the present invention). These drawings are given as a comparison of the results of these cases.

As shown in FIG. 8, during transfer under attainable vacuum, contamination of the wafer surface precluded adequate HSG formation (the surface was not very bumpy), whereas, when the wafer was transferred while nitrogen gas ($N_2$) was supplied to and exhausted from the load-lock chamber 10, the transfer chamber 20, and the reaction chamber 30 (supplied under conditions of flux=0.5 slm, during which time the transfer pressure=50 Pa), as in FIG. 9, good HSG formation was possible. Similar results were obtained when the pressure was over 50 Pa.

Examples of applying the present invention to an HSG formation process were given above, but the present invention can also be applied to a semiconductor manufacturing apparatus and manufacturing method involving an epitaxial growth process. In this case, when the $N_2$ supply to the transfer chamber was adjusted to a flux of 10 slm and a transfer pressure of 400 to 1333 Pa, the crystal defects that occurred during conventional transfer under attainable vacuum did not occur. Similarly, the present invention can also be applied to doping processing (such as p doping), and film formation processing (eg, $Ta_2O_5$ films, $Si_3N_4$ films, and polycrystalline silicon films).

As described above, with the present invention, an inert gas is supplied to and exhausted from the preliminary chamber, transfer chamber, or process chamber during the transfer of a substrate, which adjusts the environment conditions so as to suppress chemical contamination, and as a result, contamination of a substrate surface present in a chamber can be minimized, affording better quality and higher yield with semiconductor elements and substrates. Furthermore, all that need be done is to add the feature of supplying and exhausting an inert gas to the chambers, so these effects can be achieved easily, at low cost, and without increasing the maintenance load.

What is claimed is:

1. A semiconductor manufacturing method, comprising:
    a first step of carrying a substrate into a preliminary chamber from an external part;
    a second step of continuously supplying and exhausting an inert gas to and from said preliminary chamber at least from a time before opening a first gate valve between said preliminary chamber and a transfer chamber, after the substrate is carried into said preliminary chamber,
    a third step of transferring said substrate to said transfer chamber from said preliminary chamber, in a state in which the inert gas is continuously supplied and exhausted to and from said preliminary chamber and said transfer chamber, after said first gate valve is opened;
    a fourth step of transferring said substrate to a process chamber from said transfer chamber in a state in which the inert gas is continuously supplied and exhausted to and from said transfer chamber and said process chamber, after a second gate valve between said transfer chamber and said process chamber is opened; and
    a fifth step of subjecting said substrate to predetermined processing in said process chamber.

2. The semiconductor manufacturing method according to claim 1, wherein the exchange of the substrate between said preliminary chamber and the outside is carried out with a cassette that holds a plurality of substrates.

3. The semiconductor method according to claim 1, wherein the predetermined processing to which the substrate is subjected in said process chamber is HSG formation or epitaxial growth.

4. The semiconductor manufacturing method according to claim 1, wherein at least one vacuum pump is coupled to said three chambers, and this vacuum pump is used when the inert gas is supplied and exhausted to and from said chamber.

5. A semiconductor manufacturing method, comprising the steps of:
    exchanging a substrate between a preliminary chamber and an external part;
    subjecting the substrate to predetermined processing in a process chamber; and
    transferring the substrate through a transfer chamber provided between said preliminary chamber and said process chamber,
    wherein said substrate transferring step comprises the following three steps:
    a first step of transferring said substrate from said preliminary chamber to said transfer chamber;
    a second step of holding in said transfer chamber said substrate transferred to said transfer chamber; and
    a third step of transferring said substrate from said transfer chamber to said process chamber; and
    wherein an inert gas is continuously supplied and exhausted to and from all of said three chambers during said three steps of said substrate transferring step.

6. The semiconductor manufacturing method according to claim 5, wherein at least one vacuum pump is coupled to said three chambers, and this vacuum pump is used when the inert gas is supplied and exhausted to and from all of said chambers.

7. A semiconductor manufacturing method, comprising the steps of:
    exchanging a substrate between a preliminary chamber and an external part;
    subjecting the substrate to predetermined processing in a process chamber; and
    transferring the substrate through a transfer chamber provided between said preliminary chamber and said process chamber,
    wherein said substrate transferring step comprises the following three steps:
    a first step of transferring said substrate from said preliminary chamber to said transfer chamber;
    a second step of holding in said transfer chamber said substrate transferred to said transfer chamber; and
    a third step of transferring said substrate from said transfer chamber to said process chamber, and
    wherein an inert gas is continuously supplied to all of said chambers coupled to a vacuum pump among said three chambers and exhausted from this chamber using said vacuum pump during said three steps of said substrate transferring step.

8. The semiconductor manufacturing method according to claim 7, wherein at least one vacuum pump is coupled to all of said three chambers.

9. A substrate processing method, comprising:
    a first step of carrying a substrate into a preliminary chamber from an external part;
    a second step of continuously supplying and exhausting an inert gas to and from said preliminary chamber at least from a time before opening a first sate between said preliminary chamber and a transfer chamber, after the substrate is carried into said preliminary chamber;
    a third step of transferring said substrate to said transfer chamber from said preliminary chamber, in a state in which the inert gas is continuously supplied and exhausted to and from said preliminary chamber and said transfer chamber, after said first gate valve is opened;

a fourth step of transferring said substrate to a process chamber from said transfer chamber in a state in which the inert gas is continuously supplied and exhausted to and from said transfer chamber and said process chamber, after a second gate valve between said transfer chamber and said process chamber is opened; and a fifth step of subjecting said substrate to predetermine processing in said process chamber.

10. The semiconductor manufacturing method according to claim 9, wherein at least one vacuum pump is coupled to said three chambers, and this vacuum pump is used when the inert gas is supplied and exhausted to and from said chamber.

11. A semiconductor manufacturing method, comprising the steps of:

exchanging a substrate between a preliminary chamber and an external part;

subjecting the substrate to predetermined processing in a process chamber; and transferring the substrate through a transfer chamber provided between said preliminary chamber and said process chamber, wherein said substrate transferring step comprises the following three steps:

a first step of transferring said substrate from said preliminary chamber to said transfer chamber;

a second step of holding in said transfer chamber said substrate transferred to said transfer chamber; and a third step of transferring said substrate from said transfer chamber to said process chamber, and wherein at least one vacuum pump is coupled to said three chambers, and in this vacuum pump, an inert gas is continuously introduced into the vacuum pump from an upstream side of the vacuum pump, and the vacuum pump operates to exhaust the inert gas in all the chambers, during said three steps of said substrate transferring step.

12. A semiconductor manufacturing method, comprising the steps of:

exchanging a substrate between a preliminary chamber and an external part;

subjecting the substrate to predetermined processing in a process chamber; and transferring the substrate through a transfer chamber provided between said preliminary chamber and said process chamber, wherein an inert gas is continuously supplied and exhausted to and from said preliminary chamber during said substrate transferring step.

13. The semiconductor manufacturing method according to claim 12, wherein a vacuum pump is coupled to at least said preliminary chamber among said three chambers, and this vacuum pump is used when the inert gas is supplied and exhausted to and from said preliminary chamber.

14. The semiconductor manufacturing method according to claim 12, wherein a cassette holding the plural substrates is used for the exchange of the substrate between said preliminary chamber and the external part, and the cassette holding the plural substrates is transferred into said preliminary chamber.

15. A semiconductor manufacturing method, comprising the steps of:

exchanging a substrate between a preliminary chamber and an external part;

subjecting the substrate to predetermined processing in a process chamber, and transferring the substrate through a transfer chamber provided between said preliminary chamber and said process chamber, the method further comprising the step of:

continuously supplying and exhausting an inert gas to and from the preliminary chamber during a period in which the substrate is present within said preliminary chamber after the substrate is transferred into said preliminary chamber.

16. The semiconductor manufacturing method according to claim 15, wherein a vacuum pump is coupled to at least said preliminary chamber among said three chambers, and this vacuum pump is used when the inert gas is supplied and exhausted to and from said preliminary chamber.

17. The semiconductor manufacturing method according to claim 15, wherein a cassette holding the plural substrates is used for the exchange of the substrate between said preliminary chamber and the external part, and the cassette holding the plural substrates is transferred into said preliminary chamber.

* * * * *

UNITED STATES PATENT AND TRADEMARK OFFICE
CERTIFICATE OF CORRECTION

PATENT NO. : 6,828,235 B2
DATED : December 7, 2004
INVENTOR(S) : Satoshi Takano

It is certified that error appears in the above-identified patent and that said Letters Patent is hereby corrected as shown below:

Column 17,
Line 45, claim 9 should read as follows:
9. A substrate processing method, comprising
a first step of carrying a substrate into a preliminary chamber from an external part;
a second step of continuously supplying and exhausting an inert gas to and from said preliminary chamber at least from a time before opening a first gate between said preliminary chamber and a transfer chamber, after the substrate is carried into said preliminary chamber;
a third step of transferring said substrate to said transfer chamber from said preliminary chamber, in a state in which the inert gas is continuously supplied and exhausted to and from said preliminary chamber and said transfer chamber, after said first gate valve is opened;
a fourth step of transferring said substrate to a process chamber from said transfer chamber in a state in which the inert gas is continuously supplied and exhausted to and from said transfer chamber and said process chamber, after a second gate valve between said transfer chamber and said process chamber is opened; and
a fifth step of subjecting said substrate to predetermine processing in said process chamber.

Signed and Sealed this

Fourteenth Day of June, 2005

JON W. DUDAS
*Director of the United States Patent and Trademark Office*